United States Patent
Lin et al.

(10) Patent No.: US 9,768,223 B2
(45) Date of Patent: Sep. 19, 2017

(54) ELECTRONICS DEVICE PACKAGE AND FABRICATION METHOD THEREOF

(75) Inventors: Chia-Sheng Lin, Taoyuan County (TW); Yu-Ting Huang, Taoyuan County (TW)

(73) Assignee: Xintec Inc., Taoyuan (TW)

( * ) Notice: Subject to any disclaimer, the term of this patent is extended or adjusted under 35 U.S.C. 154(b) by 518 days.

(21) Appl. No.: 13/333,899

(22) Filed: Dec. 21, 2011

(65) Prior Publication Data
US 2013/0161778 A1   Jun. 27, 2013

(51) Int. Cl.
H01L 31/18 (2006.01)
H01L 27/146 (2006.01)
H01L 23/00 (2006.01)

(52) U.S. Cl.
CPC .. *H01L 27/14683* (2013.01); *H01L 27/14618* (2013.01); *H01L 24/05* (2013.01); *H01L 24/11* (2013.01); *H01L 24/13* (2013.01); *H01L 24/48* (2013.01); *H01L 24/94* (2013.01); *H01L 2224/0401* (2013.01); *H01L 2224/04042* (2013.01); *H01L 2224/05624* (2013.01); *H01L 2224/05647* (2013.01); *H01L 2224/13* (2013.01); *H01L 2224/13101* (2013.01); *H01L 2224/48091* (2013.01); *H01L 2224/48463* (2013.01); *H01L 2924/00014* (2013.01); *H01L 2924/1461* (2013.01)

(58) Field of Classification Search
CPC .......................................................... H01L 31/18
USPC ............................................................ 257/460
See application file for complete search history.

(56) References Cited

U.S. PATENT DOCUMENTS

| | | | |
|---|---|---|---|
| 6,621,169 B2 * | 9/2003 | Kikuma et al. ............... 257/780 |
| 2006/0292734 A1 * | 12/2006 | Kim ................... H01L 27/14621 438/70 |
| 2008/0038868 A1 * | 2/2008 | Leib ..................... H01L 21/50 438/107 |
| 2008/0230877 A1 * | 9/2008 | Chung et al. ................. 257/666 |
| 2009/0289318 A1 * | 11/2009 | Lin .................... H01L 27/14618 257/433 |
| 2010/0181283 A1 * | 7/2010 | Chuang et al. ................ 216/13 |
| 2010/0181686 A1 * | 7/2010 | Sugino et al. ................ 257/777 |
| 2014/0332908 A1 * | 11/2014 | Ho .................... H01L 21/76802 257/414 |

* cited by examiner

*Primary Examiner* — Kenneth Parker
*Assistant Examiner* — Christopher Culbert

(57) ABSTRACT

Embodiments provide a chip device package and a method for fabricating thereof. A semiconductor chip has a substrate. A supporting brick is separated from the substrate by a certain distance. A bonding pad having a surface is disposed across the substrate and the supporting brick. A bonding wire is electrically connected to the bonding pad.

15 Claims, 16 Drawing Sheets

US 9,768,223 B2

ELECTRONICS DEVICE PACKAGE AND FABRICATION METHOD THEREOF

BACKGROUND OF THE INVENTION

Field of the Invention

The present invention relates to an electronic device package and a fabrication method thereof, and in particular relates to an electronic device package fabricated by a wafer scale package and a fabrication method thereof.

Description of the Related Art

Photosensitive integrated circuits, such as imaging sensors, play an import role in capturing images in optical electronics devices. These integrated circuits have been found in consumer electronic products and portable devices such as digital cameras, digital recorders, and cellular phones.

FIG. 1 is a cross-sectional view of a prior-art image sensor package 1. Referring to FIG. 1, a photosensitive device 4 and a bonding pad 6 are formed on a substrate 2. A covering plate 8 is deposited on the substrate 2. A carrier 9 is attached to the substrate 2. A solder ball 12 is deposited on a back surface of the carrier 9. The solder ball 12 is electrically connected with the bonding pad 6 by a conductive trace layer 10. While the photosensitive device 4 senses light passing through the covering plate 8, a signal is produced. The signal is transferred to the solder ball 12 and an external circuit by the conductive trace layer 10.

BRIEF SUMMARY OF INVENTION

An embodiment of the invention provides an electronic device package. The electronic device package, comprising: a semiconductor chip having a first substrate; a supporting brick separated from the first substrate by a distance; a bonding pad having a surface across the first substrate and the supporting brick; and a bonding wire electrically connected to the bonding pad. In another embodiment, the first substrate has a first surface and a second surface opposite to the first surface, wherein the second surface is used as light incident surface, and the first surface is used as light back surface and comprises a photosensitive region. The electronic device package may further comprise a second substrate attached to the light back surface of the first substrate; a first packaging layer covering the light incident surface of the first substrate; a second packaging layer covering the second substrate; a conductive trace layer formed under the second packaging layer and extended to a sidewall of the bonding pad and the supporting brick to be electrically connected with the bonding pad; and a conductive bump disposed under the second packaging layer and electrically connected with the conductive trace layer.

In the electronic device package, an insulator is filled between the supporting brick and the first substrate to isolate the supporting brick and the first substrate. Moreover, the bonding pad is disposed across the insulator. Therefore, the conductive trace formed on a sidewall of the supporting brick does not influence the photosensitive device. Otherwise, because the electronic device has the supporting brick, the conductive trace and the bonding pad (or the T contact structure) are strengthened, thus strengthening the entire image sensor package.

Another embodiment of the invention provides a fabrication method for an electronic device package, comprising: providing a wafer with a substrate having a plurality of die regions, wherein a plurality of semiconductor chips are supported by or formed on the substrate and a plurality of bonding pad are formed on the substrate; packaging the substrate at a wafer level, comprising: patterning the substrate to form a supporting brick in each die region for separating the supporting brick from the substrate by a distance and exposing the bonding pad; and forming bonding wires to electrically connect to the bonding pads, respectively. The fabrication method further comprises forming a patterned opening in the substrate by the pattering step for exposing the bonding pad.

In the fabrication method, the semiconductor chips comprise opto devices, the substrate serves as a first substrate, the first surface thereof comprising a light back surface and the second surface thereof comprising a light-emitting surface or light incident surface, the wafer level packaging further comprises: providing a first packaging layer to cover the light-emitting surface or the light incident surface of the first substrate; attaching the back surface of the first substrate to a second substrate; and segmenting the second substrate along a predetermined scribe line between two die regions into a plurality of carriers corresponding to the die regions.

In the fabrication method, the wafer level packaging further comprises: forming an insulator to cover at least sidewalls of the carriers; providing a second packaging layer to cover the second substrate and the insulator; forming a channel notch at the position of the predetermined scribe line between two die regions for exposing the surface of the first packaging layer; forming a conductive trace layer under the second packaging layer extending to a sidewall of the bonding pad and supporting brick along the channel notch to be electrically connected with the bonding pad; forming a conductive bump under the second packaging layer, wherein the conductive bump is electrically connected with the conductive trace layer; and segmenting the first packaging layer along the predetermined scribe line.

In the fabrication method for the electronic device package, the manufacturing process is simplified, since exposing the bonding pad for testing the photosensitive device and segmenting the first substrate with the photosensitive region is achieved by the patterned opening.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

The fabrication and application of the presently preferred embodiments are discussed in detail below. It should be appreciated, however, that the present invention provides many applicable inventive concepts that can be embodied in a wide variety of specific contexts. The specific embodiments discussed are merely illustrative of specific ways to fabricate and apply the invention, and do not limit the scope of the invention.

A method for forming an image sensor package, with, for example, a back side illumination (BSI), is used to describe the disclosure. However, it is understood that the invention is equally applicable to a variety of electronic devices including active or passive elements, digital or analog circuits or other integrated circuits, such as opto electronics devices, micro electro mechanical systems (MEMS), micro fluidic systems or physical sensors used for testing by measuring variations of heat, light or pressure. Moreover, the wafer scale package (WSP) process can be used for packaging semiconductor chips, such as image sensors, light-emitting diodes (LEDs), solar cells, RF circuits, accelerators, gyroscopes, micro actuators, surface acoustic wave devices, process sensors or ink printer heads.

In the wafer scale package process, a wafer is sliced into chips after being packaged at a wafer level. Moreover, sliced chips can be arranged on a carrying wafer and then packaged. In addition, the wafer scale package process is also suitable for stacked wafers for forming multi-layered integrated circuit device packages.

FIGS. 2 to 11 illustrate an embodiment of the method for fabricating the imaging sensor package. FIG. 12 is a process flow of the method for fabricating the imaging sensor package.

Figure 1:
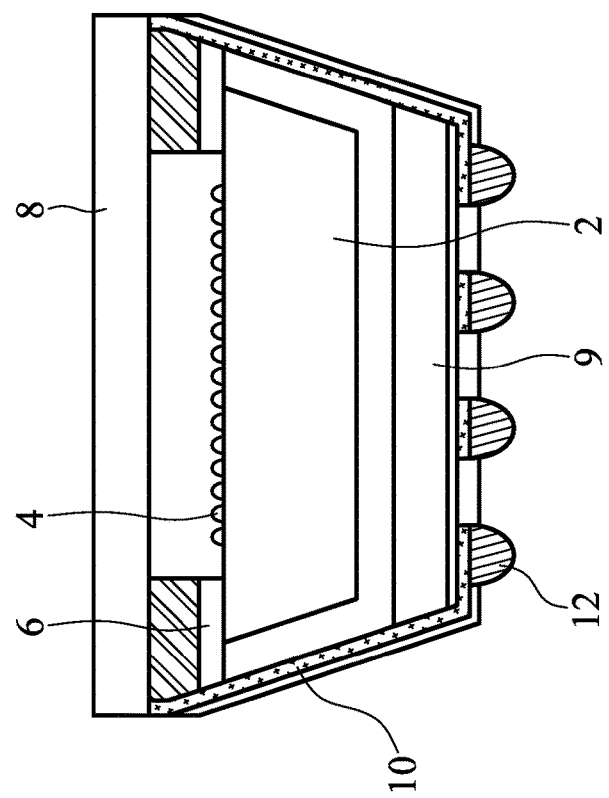
FIG. 1 is a cross-sectional view of a prior-art image sensor package.
Figure 2:
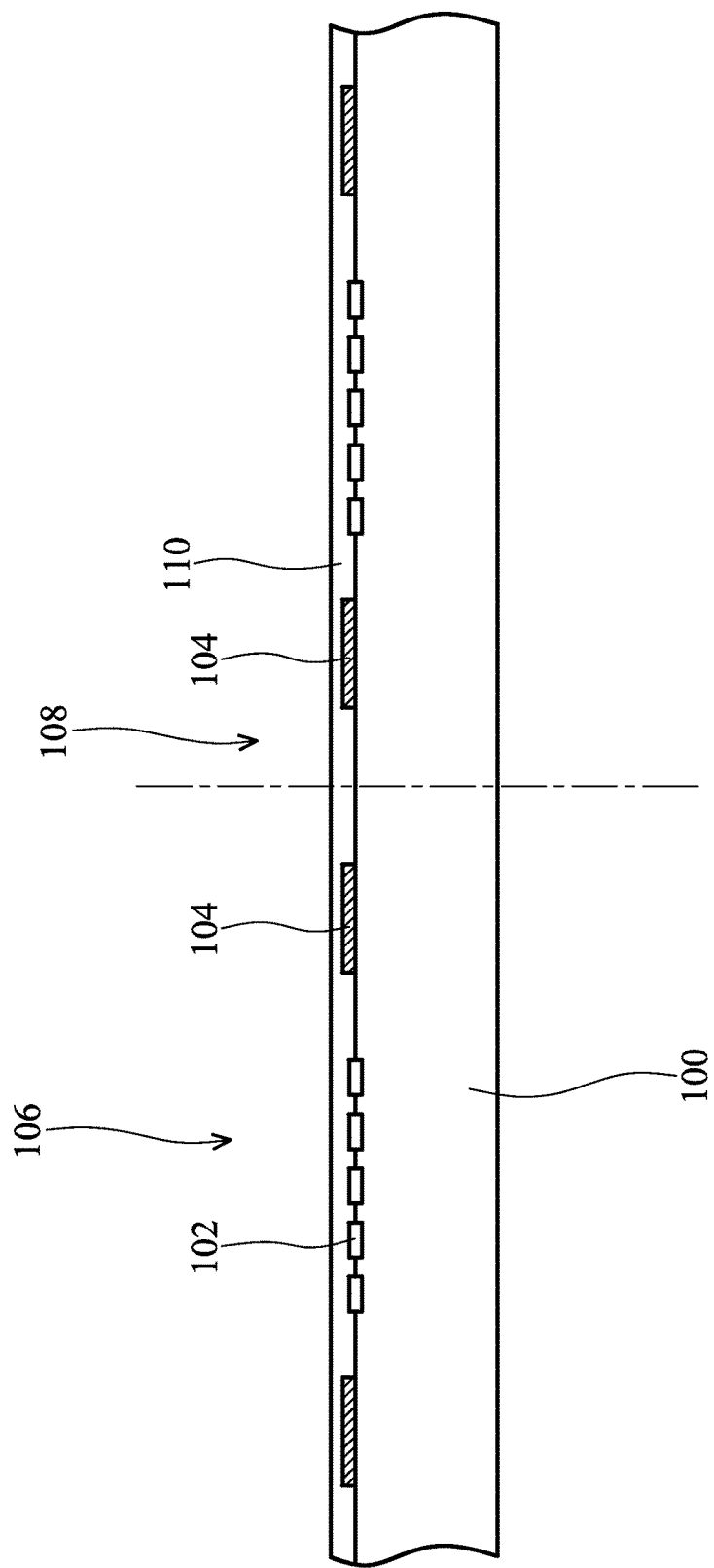
FIGS. 2 to 11 illustrate an embodiment of the method for fabricating the imaging sensor package.

Referring to FIG. 2, a wafer (or wafer substrate) is provided. The wafer includes a first substrate 100 with a photosensitive device 102 formed thereon. A plurality of bonding pads 104 are formed on the first substrate 100. Moreover, the photosensitive device 102 is electrically connected with the bonding pad 104. Thus, a signal can be transferred to a terminal contact (not shown). Then, a passivation layer 110 is formed over the first substrate 100, covering the bonding pad 104 and photosensitive device 102.

In FIG. 2, the first substrate 100 is defined into several photosensitive regions 106 and non-photosensitive regions 108. The photosensitive region 106 is a region with the photosensitive device 102 formed thereon. On the contrary, the non-photosensitive region 108 is a region without the photosensitive device 102 formed thereon, or between two photosensitive regions 106. The non-photosensitive region 108, or so-called predetermined scribe line, is the region subsequently cut for slicing the wafer into several chips. Moreover, the non-photosensitive region 108 surrounds the photosensitive region 106. In addition, the photosensitive region 106 can be called a die region.

In one embodiment, the first substrate 100 can be silicon or other suitable semiconductor materials. The photosensitive device 102 may be a CMOS or a charge-couple device (CCD) used for sensing images. Moreover, the bonding pad 104 can be called an extension pad or conductive pad. In addition, the bonding pad 104 may be copper (Cu), aluminum (Al) or other suitable metal materials.

Figure 3:
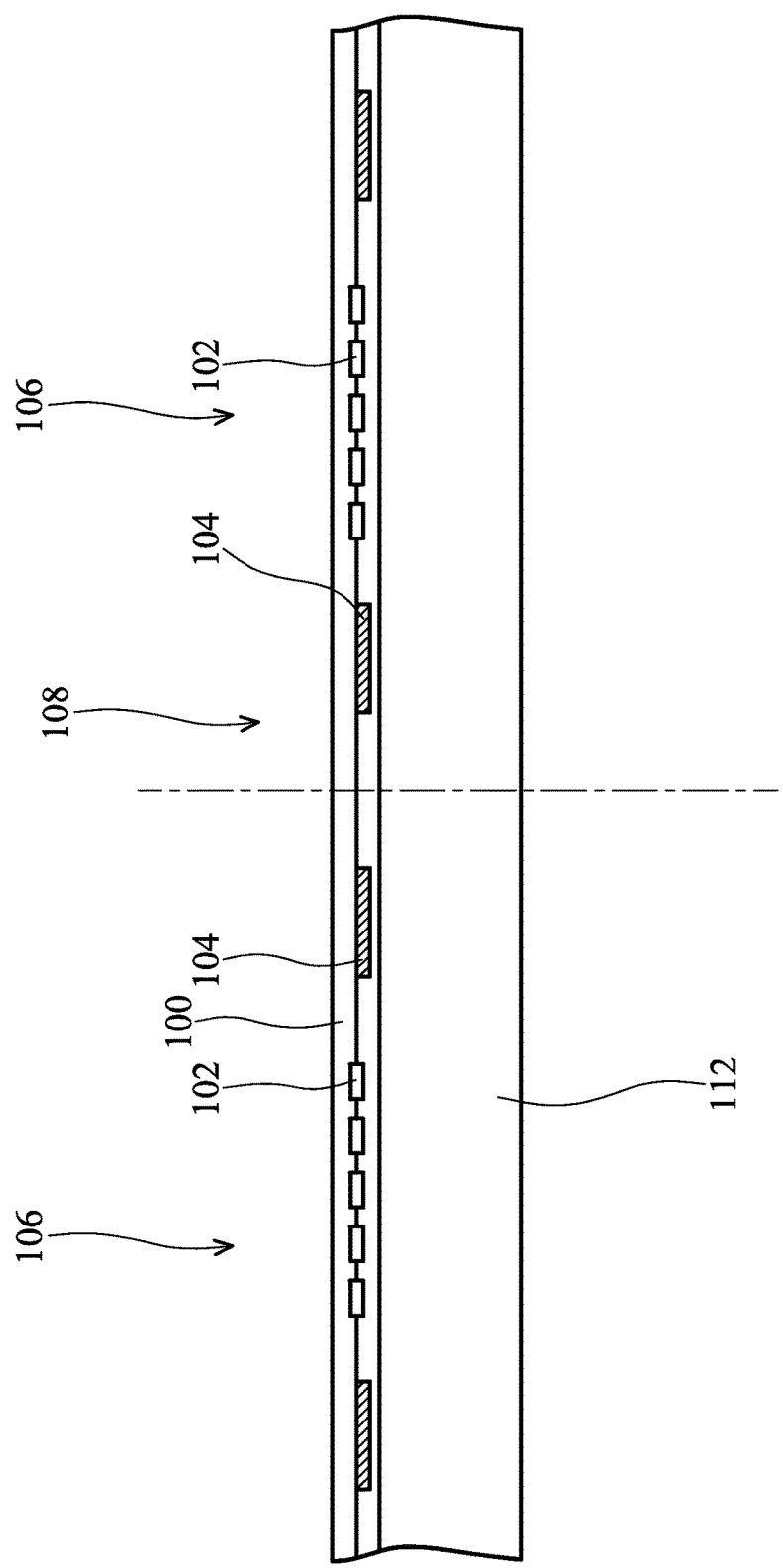

Referring to FIG. 3, a second substrate 112, such as silicon or other suitable semiconductor materials, is provided. The first substrate 100 is reversed and then attached to a surface of the second substrate 112. Therefore, the photosensitive device 102 is located between the first substrate 100 and the second substrate 112. Then, the first substrate 100 is thinned down to a preferred thickness by etching, milling or grinding and polishing the back surface. Thus, the photosensitive device 102 can sense the light incident through the back surface of the first substrate 100. Namely, the first substrate 100 is thinned down to the thickness that allows light to pass therethrough. Therefore, the photosensitive device 102 senses the light, and a signal is thus produced. Note that the thickness of the thinned first substrate 100, which permits light to pass therethrough, is not limited thereto.

A front surface of the first substrate 100, forming surfaces of the bonding pad 104 and the photosensitive device 102, can be called a light back surface. Meanwhile, the surface (or back surface of the first substrate 100) opposite to the front surface can be called a light incident surface. It is noted that, in other LED embodiments, the back surface of the first substrate 100 also can be called a light-emitting surface.

Figure 4:
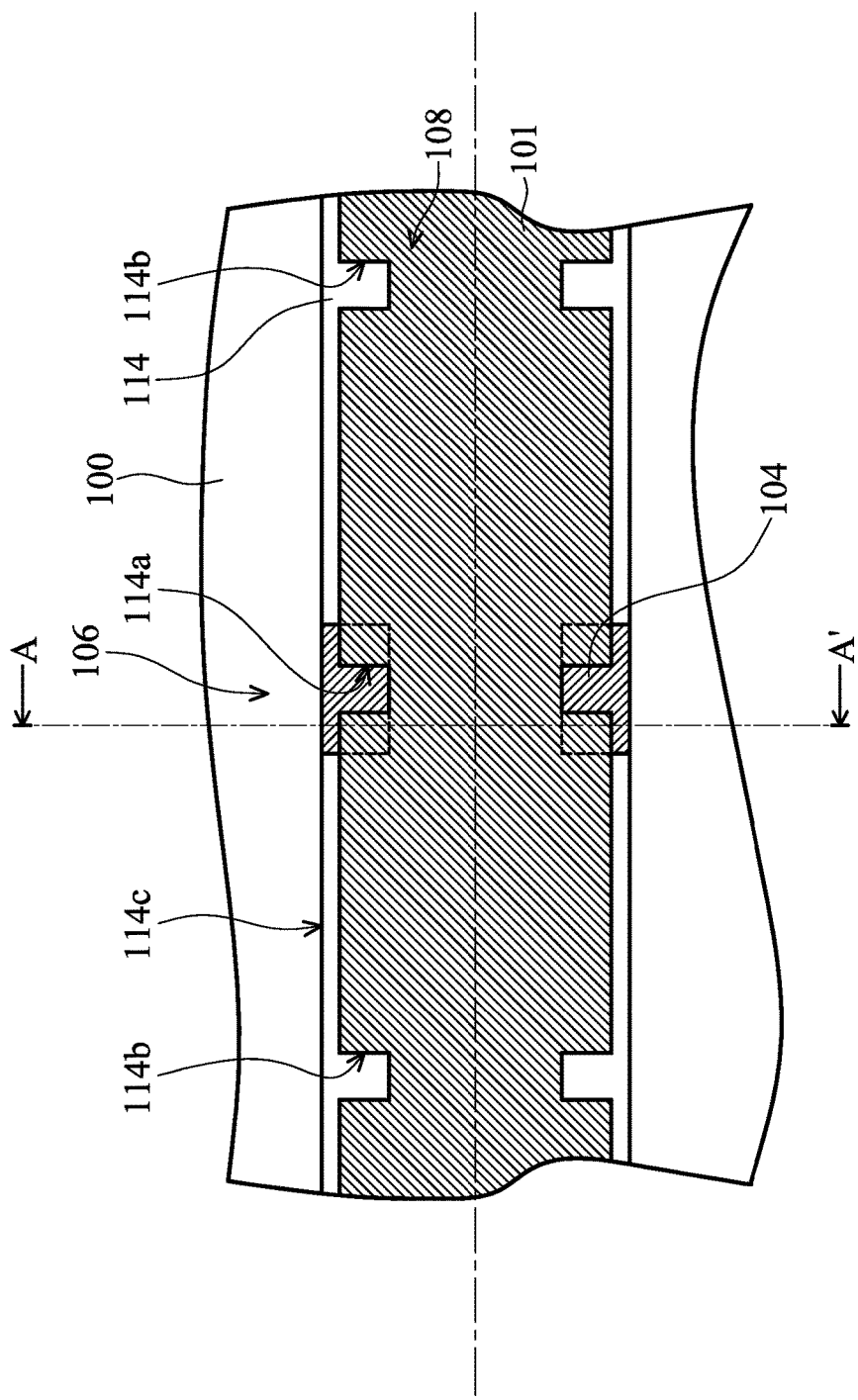

FIG. 4 is a top view of a portion of the first substrate 100 after being patterned. Referring to FIG. 4, after the thinning step, a patterned opening 114 is formed in the first substrate 100 to expose the bonding pad 104 by a photolithography/etching process. Meanwhile, the patterned opening 114 segments the first substrate 100 in the photosensitive region 106 and the first substrate 100 in the non-photosensitive region 108, is called a segmented first substrate 101. Moreover, by the patterning step, the first substrate 100 or wafer is segmented into chips.

Referring to FIG. 4, the patterned opening 114 comprises a first opening 114a, a second opening 114b and a trench 114c. The trench 114c communicates with the first opening 114a and the second opening 114b. Furthermore, the first opening 114a exposes a portion of the bonding pad 104 for testing the photosensitive device 102 in the photosensitive region 106. A position of the second opening 114b corresponds with the first opening 114a. In addition, a length of the second opening 114b is substantially the same as that of the first opening 114a. Moreover, the trench 114c, disposed between the photosensitive region 106 and the non-photosensitive region (predetermined scribe line) 108, segments the first substrate 100 in the photosensitive region 106 and the first substrate 101 in the non-photosensitive region 108. It is noted that the patterned opening 114 can be any shape that is used for exposing the bonding pad and segmenting formed devices. Accordingly, the patterned opening 114 is not limited to the design as shown in FIG. 4.

Figure 5:
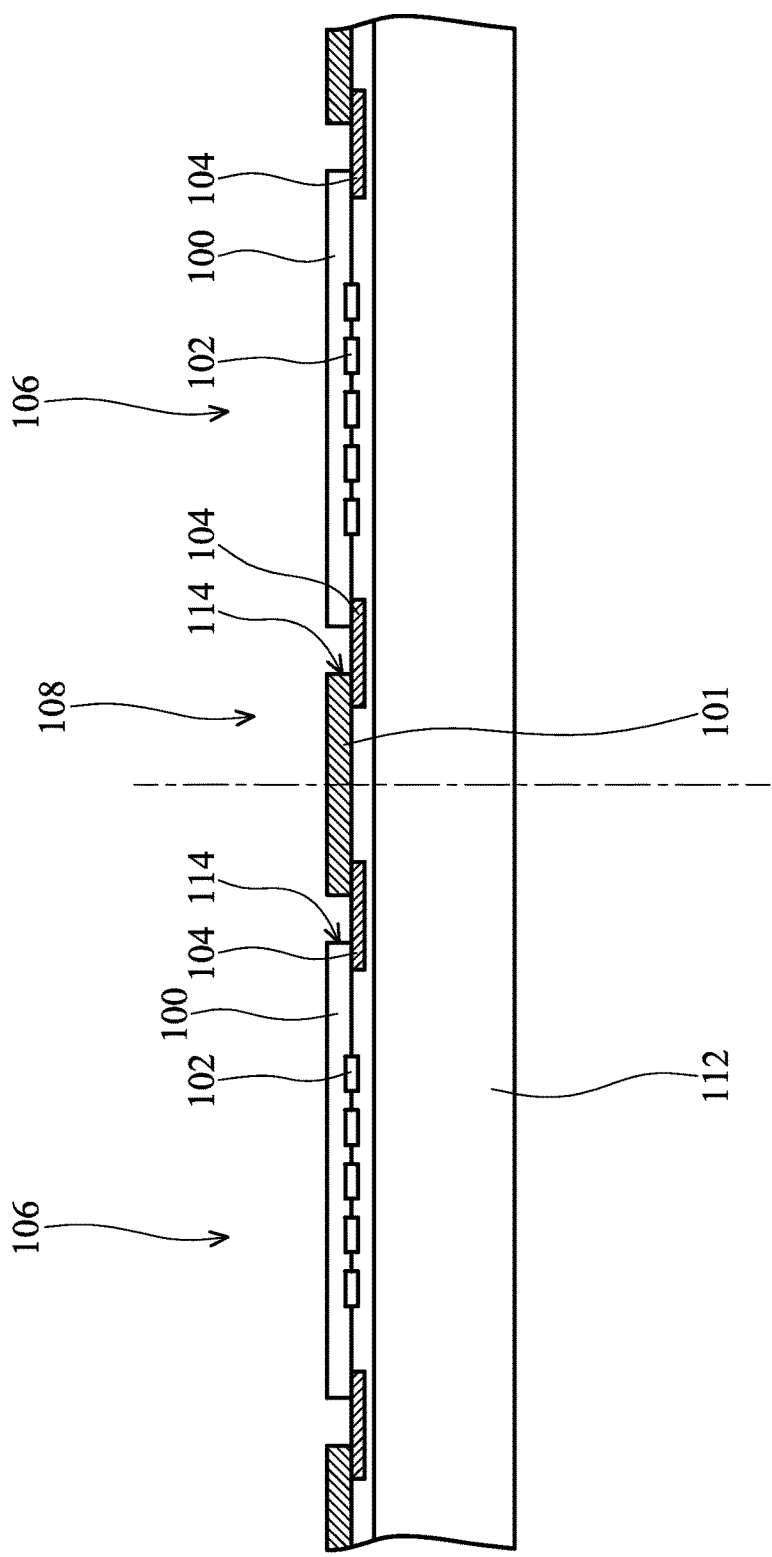

FIG. 5 shows a cross section taken along line A-A' of FIG. 4. Referring to FIG. 5, the patterned opening 114 is formed in the first substrate 100 to expose a portion of the bonding pad 104. The first substrate 100 and the first substrate 101 are separated by the patterned opening 114. Therefore, without an extra segmenting or opening formation process, the patterned opening 114 can expose the bonding pad 104 and segment the photosensitive region.

Figure 6:
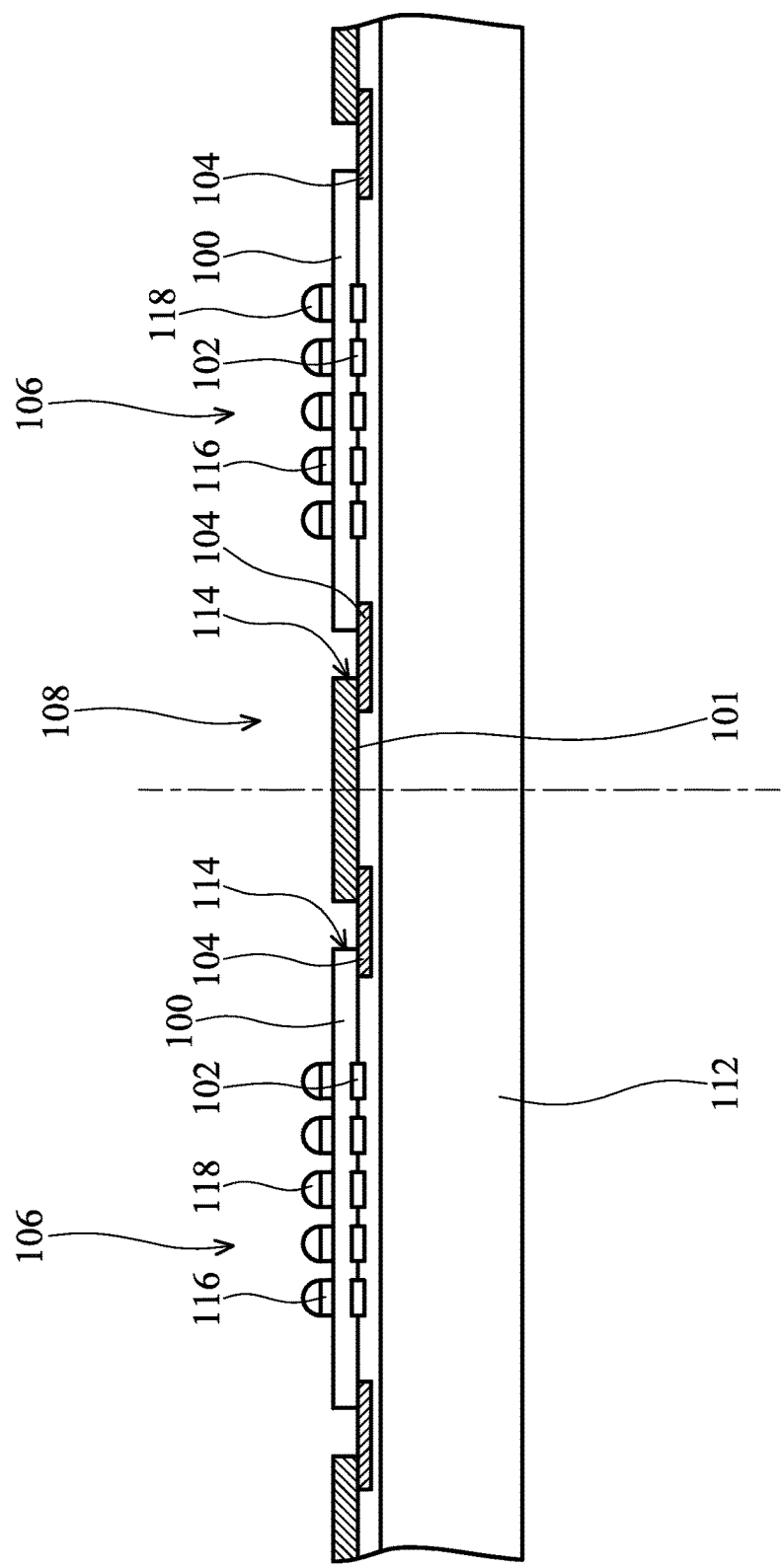

Referring to FIG. 6, a color filter 116 is formed on the back surface of the first substrate 100. A micro lens 118 is deposited on the color filter 116. The micro lens 118 may be phenolic resin, melamine resin, epoxy or other suitable materials.

Figure 7:
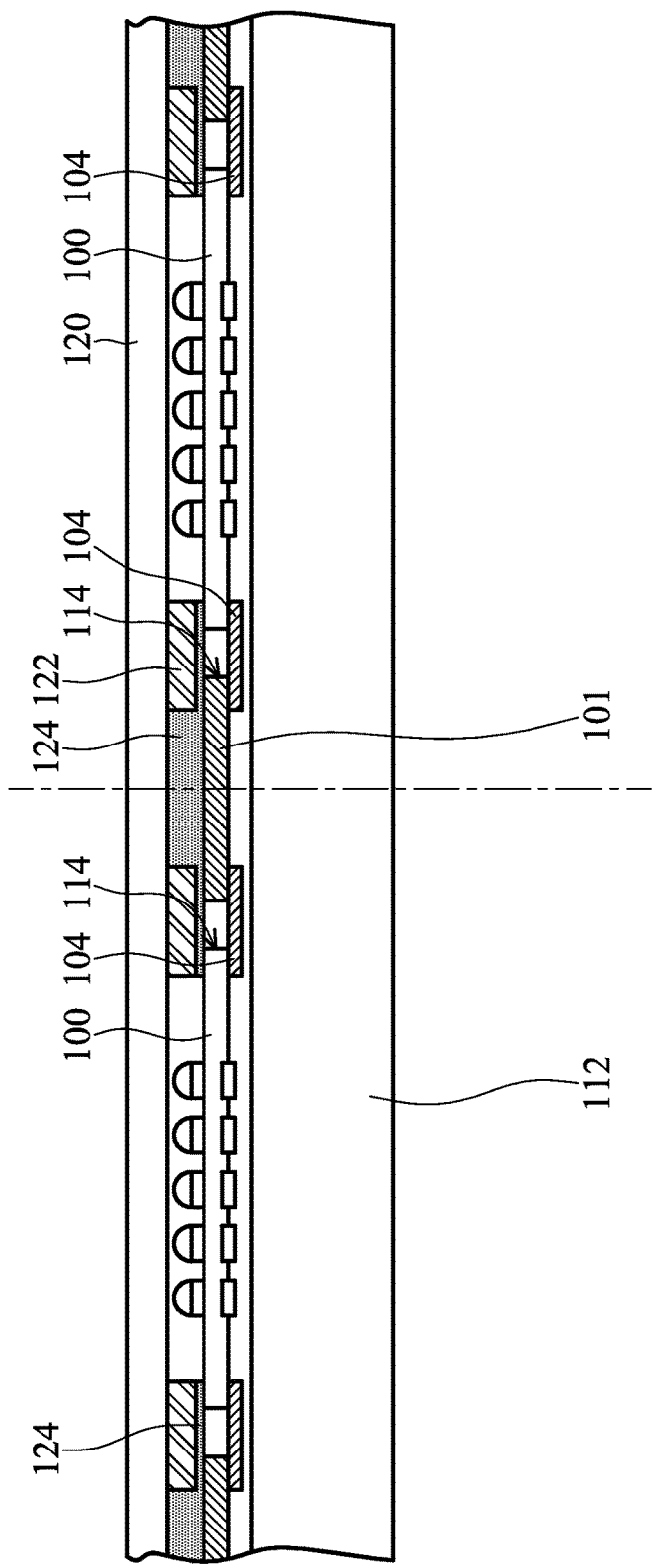

Referring to FIG. 7, an upper packaging layer (covering plate) 120 is formed on the back surface of the first substrate 100. In one embodiment, first, the upper packaging layer 120 is provided. A spacer 122 is formed on the upper packaging layer 120. A bonding layer 124 is formed on the spacer 122. Then, the upper packaging layer 120 is attached to the first substrate 100 to cover the back surface of the first substrate 100. The upper packaging layer 120 may be a glass, quartz, opal, plastics or other transparent substrates that light can pass through. Otherwise, a filter and/or anti-reflective layer can be selectively formed on the upper packaging layer.

The spacer 112 may be an epoxy, solder mask or other suitable insulating materials, such as, silicon oxide, silicon nitride, silicon oxinitride, metal oxide or combination thereof of inorganic materials, or polyimide (PI), butylcyclobutene (BCB), parylene, polynaphthalenes, fluorocarbons or acrylates of organic materials. The spacer 112 can be formed by spin coating, spray coating, curtain coating, or any suitable deposition method, such as a liquid phase deposition, physical vapor deposition (PVD), chemical vapor deposition (CVD), low pressure chemical vapor deposition (LPCVD), plasma enhanced chemical vapor deposition (PECVD), rapid thermal chemical vapor deposition (RTCVD) or atmospheric pressure chemical vapor deposition (APCVD) method. The spacer 112 prevents contamination or moisture.

Moreover, the bonding layer 124 is used to attach the upper packaging layer 120 and the spacer 122 to the first substrate 100. The bonding layer 124 may include a polymer film, or one or more of an adhesive such as an epoxy or polyurethane. Otherwise, it is noted that the color filter 116, bonding layer 124 or spacer 122 can be filled into the patterned opening 114 to form an insulator, not shown, used for separating the first substrate 100 and the first substrate 101.

Figure 8:
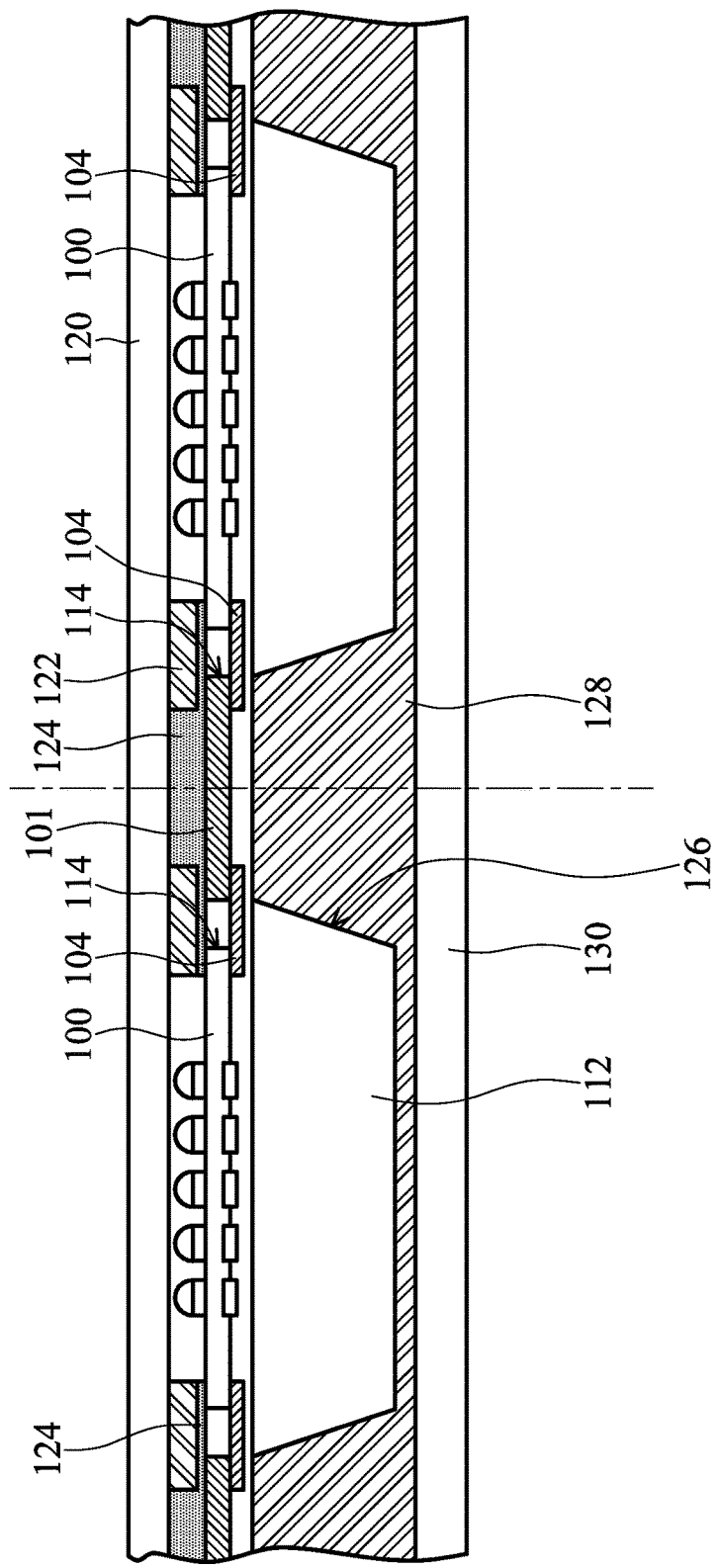

Referring to FIG. 8, after the steps described above, a notch 126 is formed in the second substrate 112 along the position of the predetermined scribe line between the photosensitive regions (die regions). The notch 126 is used to segment the second substrate 112 and to form carriers corresponding to the photosensitive region. Then, an insulating layer 128 is formed to cover a sidewall and a back surface of the second substrate 112. A lower packaging layer 130 is formed on the back surface of the second substrate 112 to cover the second substrate 112 and insulating layer 128.

The insulating layer 128 may be an epoxy, solder mask or other suitable insulating materials, such as, silicon oxide, silicon nitride, silicon oxinitride, metal oxide or combination thereof of inorganic materials, or polyimide (PI), butylcyclobutene (BCB), parylene, polynaphthalenes, fluorocarbons or acrylates of organic materials. The spacer 112 can be formed by spin coating, spray coating, curtain coating, or any suitable deposition method, such as a liquid phase deposition, physical vapor deposition (PVD), chemical vapor deposition (CVD), low pressure chemical vapor deposition (LPCVD), plasma enhanced chemical vapor deposition (PECVD), rapid thermal chemical vapor deposition (RTCVD) or atmospheric pressure chemical vapor deposition (APCVD) method. The insulating layer 128 is used to subsequently separate the second substrate 112 and form a conductive trace layer.

The packaging layer 130 can be used to carry the first substrate 100 and the second substrate 112. Furthermore, the packaging layer 130 can be a thermal conductor, such as, but not limited to, silicon or metal.

Figure 9:
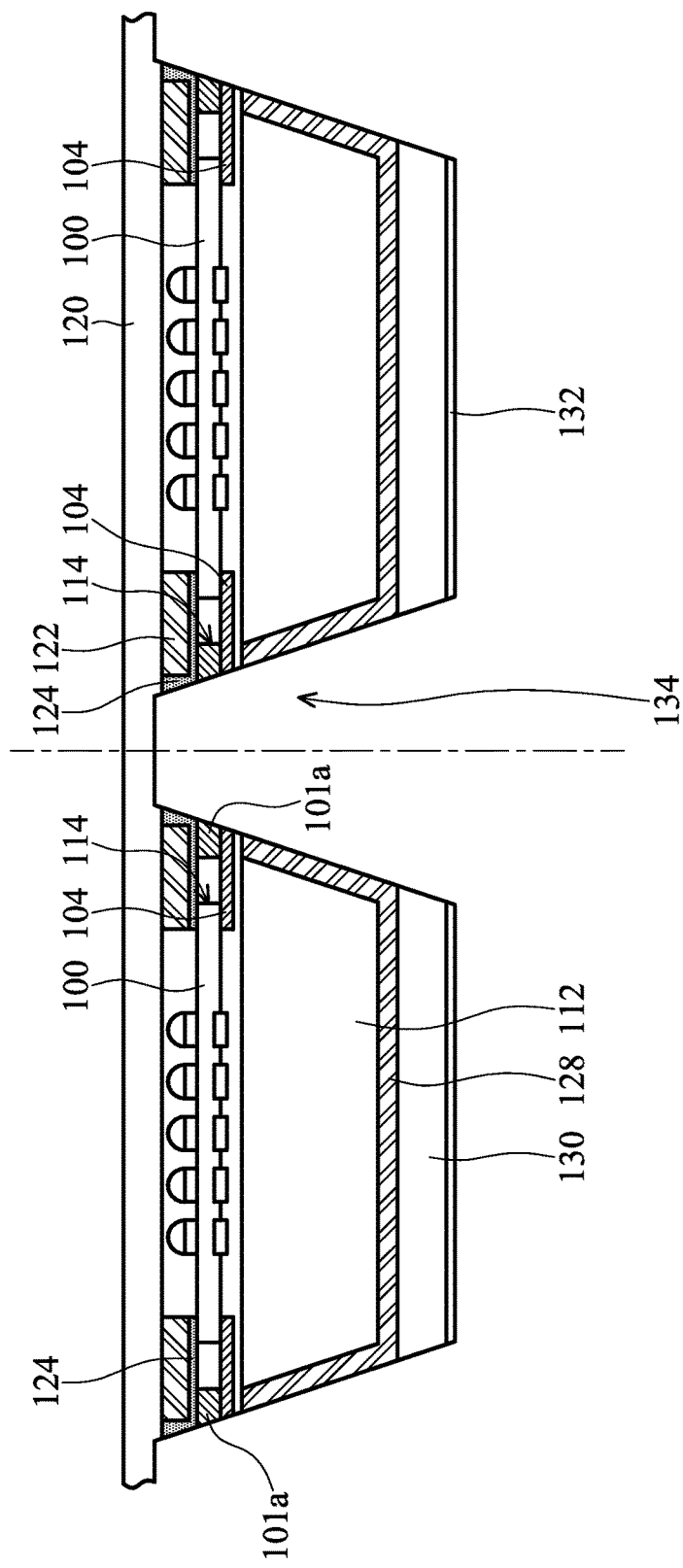

Referring to FIG. 9, after forming the lower packaging layer 130, an insulator is selectively formed on the lower packaging layer 130. Then, a channel notch 134 and a supporting brick 101a are formed by a notching process. In one embodiment, the channel notch 134, exposing a surface of the upper packaging layer, is formed by notching along the predetermined scribe line by using, for example, notching equipment. Since the scribe line includes the segmented first substrate 101 (as shown in FIG. 8), a portion of the first substrate 101 is removed by the notching step. The remaining first substrate 101 is used as the supporting brick 101a.

It is noted that the package structure is strengthened due to the presence of the first substrate 101 while notching, thus damage, such as cracking, is avoided. The material of the supporting brick 101a is not limited to silicon. The material of the supporting brick 101a can be similar with the first substrate 100.

Figure 10:
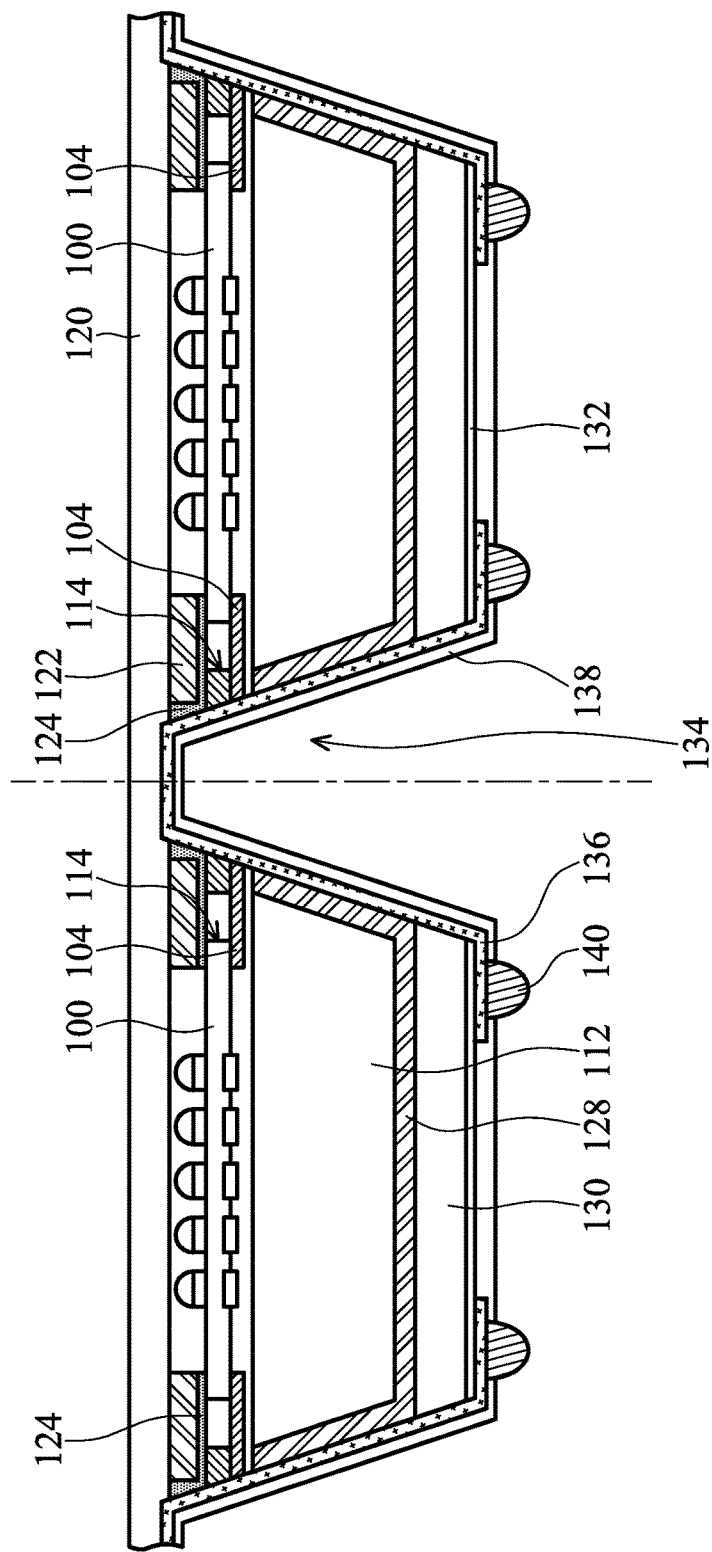

Referring to FIG. 10, a conductive trace 136 is formed on the back surface of the lower packaging layer 130, and extended to a sidewall of the bonding pad 104 and supporting brick 101a along the channel notch 134. The conductive trace 136 is electrically connected with the bonding pad 104. In one embodiment, a conductive material, such as copper, aluminum, silver, nickel or alloy thereof, is conformally formed on the lower packaging layer 130 by electroplating or sputtering. Moreover, the conductive material is further extended to a sidewall of the lower packaging layer 130, insulating layer 128, bonding pad 104 and supporting brick 101a, and a bottom of the channel notch 134. The conductive material is electrically connected with the bonding pad 104. Then, the conductive material is patterned to form the conductive trace 136 by a method such as a photolithography/etching process.

It is noted that, by patterning the conductive material, a subsequent area where the conductive bump can be formed is expanded to the entire back surface from an edge of the lower packaging layer. Thus, the conductive trace 136 can be called a redistribution layer. Moreover, the conductive trace 136 may be a material such as doped polysilicon, monocrystalline silicon or conductive glass, or an annealed deposition layer such as titanium, molybdenum, chromium or titanium tungsten.

Furthermore, since the supporting brick 101a is separated from the first substrate 100 by the patterned opening 114 filled with the insulator, the conductive trace 136 formed on a sidewall of the supporting brick 101a does not influence the sensor device.

Referring to FIG. 10, a passivation layer 138, such as solder mask, is coated on the conductive trace 136. In addition, a conductive bump 140 is formed under the lower packaging layer 130. The conductive bump 140 is electrically connected with the conductive trace 136. In one embodiment, after the passivation layer 138 is formed, the passivation layer 138 is patterned to form an opening exposing a portion of the conductive trace 136. The conductive bump 140, such as solder ball or solder paste, is formed by filling a solder into the opening by screen printing followed by a re-flow process. Then, the upper packaging layer 120 is split and thus image sensor packages 150 are provided as shown in FIG. 11 by slicing along the predetermined scribe line using a cutter.

Figure 11:
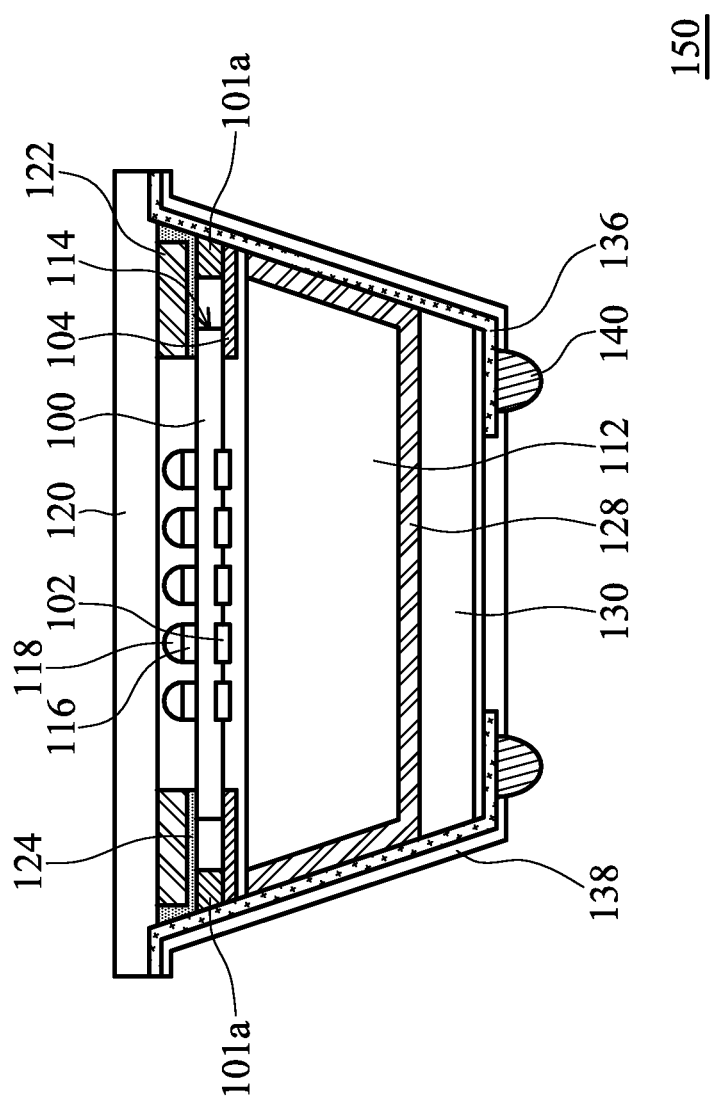
Figure 12:
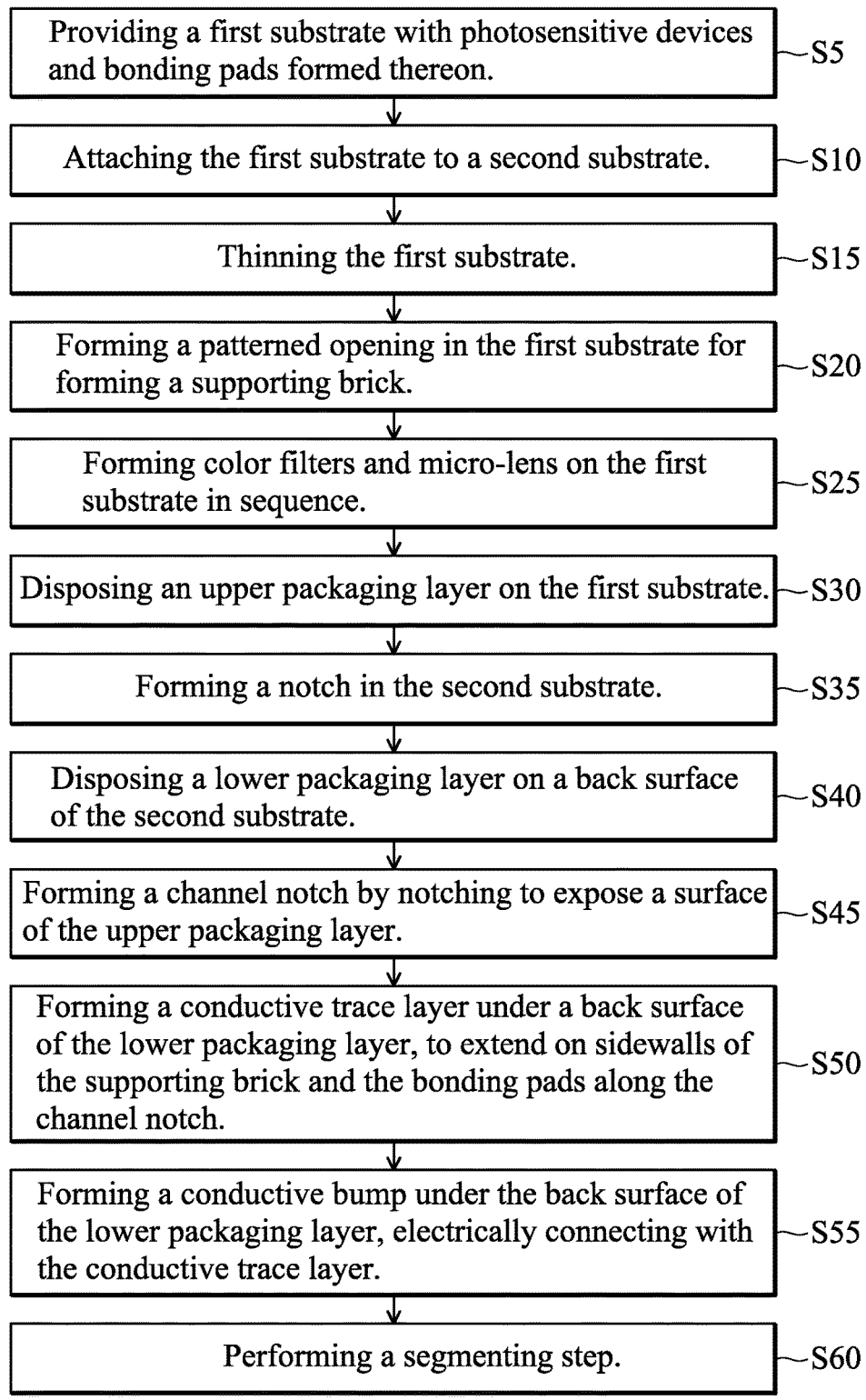
FIG. 12 is a process flow of the method for fabricating the imaging sensor package.

FIG. 11 shows a cross section of an image sensor package 150 of one embodiment according to the invention. Referring to FIG. 11, a semiconductor chip has a first substrate 100. A supporting brick 101a is separated from the first substrate 100 at a certain distance. A bonding pad 104 has a surface across the first substrate 100 and supporting brick 101a. Referring to FIG. 11, the first substrate 100 has a first surface and a second surface opposite to the first surface. A photosensitive device 102 is formed on the first surface of the first substrate 100. A second substrate 112 is connected to the first surface of the first substrate 100. The second surface of the first substrate 100 and the second substrate 112 are covered by an upper packaging layer 120 and a lower packaging layer 130, respectively. Referring to FIG. 11, a conductive trace 136 is formed under the lower packaging layer 130. Moreover, the conductive trace 136 is extended to a sidewall of the bonding pad 104 and supporting brick 101a. The conductive trace 136 is electrically connected with the bonding pad 104. In addition, a conductive bump 140 is formed under the lower packaging layer 130. The conductive bump 140 is electrically connected with the conductive trace 136.

In one embodiment, the second surface of the first substrate 100 can be used as a light incident surface. Moreover, the first surface with a photosensitive device 102 formed thereon can be used as a light back surface. External light can pass through the light incident surface and reach the photosensitive device 102. Thus, a signal is produced by the photosensitive device 102. Then, the signal is transferred to the conductive bump 140 by the bonding pad 104 and conductive trace 136.

It is noted that the supporting brick and the first substrate are coplanar. In addition, an insulator is filled between the supporting brick and the first substrate to isolate the supporting brick and the first substrate. Moreover, the bonding pad is disposed across the insulator. Therefore, the conductive trace formed on a sidewall of the supporting brick does not influence the photosensitive device. Otherwise, because the supporting brick is disposed on the bonding pad (the position of the T contact), the conductive trace and the bonding pad (or the T contact structure) are strengthened, thus strengthening the entire image sensor package.

FIG. 12 is a process flow of the method for fabricating the imaging sensor package. Referring to FIG. 12, first, a first substrate with photosensitive devices and bonding pads formed thereon are provided in the step S5. Then, in the step S10, the first substrate is attached to a second substrate. In the step S15, the first substrate is thinned. Then, a patterned opening is formed in the first substrate for forming a supporting brick and exposing a portion of the bonding pad in the step S20. In the step S25, color filters and micro-lens are formed on the first substrate in sequence. Next, an upper packaging layer is disposed on the first substrate, and a notch is formed in the second substrate for dividing the second substrate in the steps S30 and S35, respectively. Then, in the step S40, a lower packaging layer is disposed on a back surface of the second substrate.

Then, in the step S45, a channel notch is formed by notching to expose a surface of the upper packaging layer. Next, a conductive trace layer is formed under a back surface of the lower packaging layer, to extend on sidewalls of the supporting brick and the bonding pads along the channel notch in the step S50. In the step S55, a conductive bump is formed under the back surface of the lower packaging layer, electrically connecting with the conductive trace layer. Finally, in the step S60, a segmenting step is performed. Therefore, completing the image sensor package process.

Therefore, the manufacturing process is simplified, since exposing the bonding pad for testing the photosensitive device and segmenting the first substrate with the photosensitive region is achieved by the patterned opening.

Figure 13:
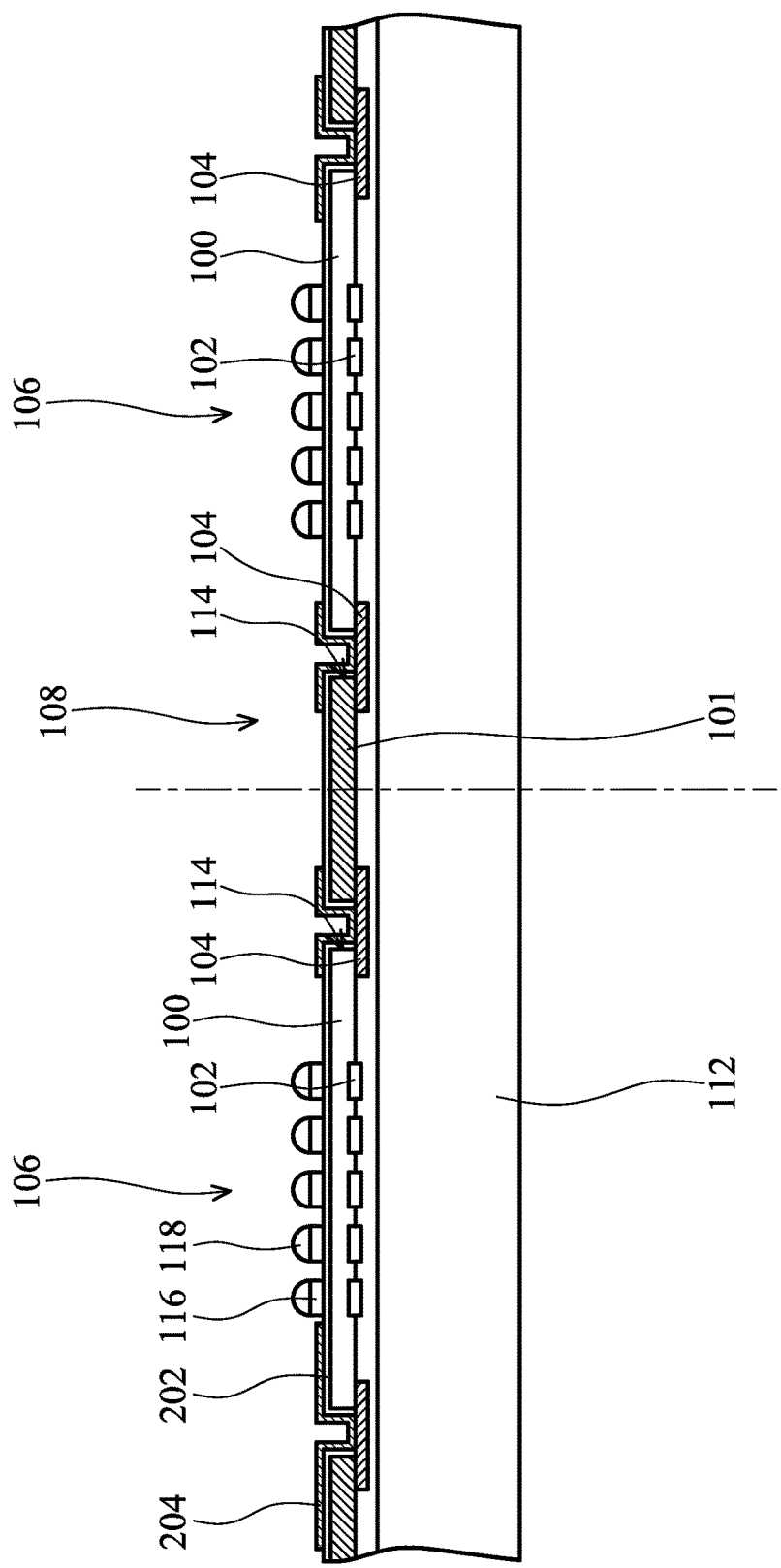
FIGS. 13-14 are cross-sectional views showing the steps of forming a chip package according to an embodiment of the present invention.
Figure 14:
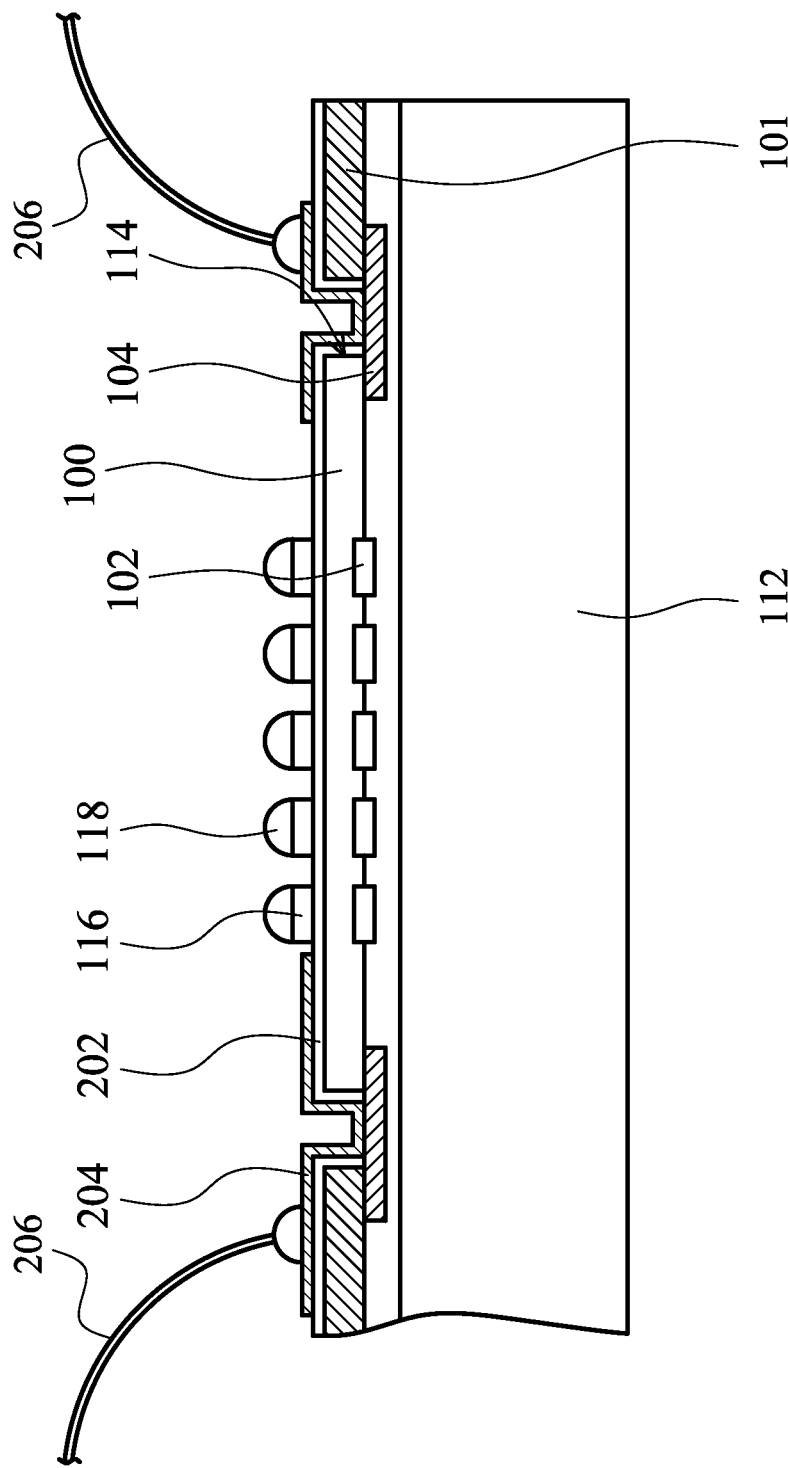

FIGS. 13-14 are cross-sectional views showing the steps of forming a chip package according to an embodiment of the present invention, wherein same or similar reference numbers are used to designate same or similar elements.

As shown in FIG. 13, a structure similar to that shown in FIG. 5 is provided. Then, an insulating layer 202 may be formed on the first substrate 100 and the first substrate 101 (also called supporting brick). The insulating layer 202 may include an epoxy, solder mask or other suitable insulating materials, such as, silicon oxide, silicon nitride, silicon oxinitride, metal oxide or combination thereof of inorganic materials, or polyimide (PI), butylcyclobutene (BCB), parylene, polynaphthalenes, fluorocarbons or acrylates of organic materials. The insulating layer 202 may be formed by spin coating, spray coating, curtain coating, or any suitable deposition method, such as a liquid phase deposition, physical vapor deposition (PVD), chemical vapor deposition (CVD), low pressure chemical vapor deposition (LPCVD), plasma enhanced chemical vapor deposition (PECVD), rapid thermal chemical vapor deposition (RTCVD) or atmospheric pressure chemical vapor deposition (APCVD) method. In one embodiment, the insulating layer 202 may fill into the patterned openings 114 and cover the bonding pads 104 thereunder, respectively. Then, the insulating layer 202 may be patterned such that the bonding pads 114 are exposed.

Then, a conducting layer may be formed on the insulating layer 202 and the exposed bonding pads 104. The conducting layer may then be patterned to form redistribution layers 204. Then, color filters 116 and micro lens 118 may be optionally formed on the photosensitive devices 102.

Next, as shown in FIG. 14, a dicing process is performed along the predetermined scribe lines to form a plurality of chip packages which are separated from each other. In one embodiment, at least a bonding wire 206 may be formed to electrically connect to the bonding pad 104. For example, the bonding wire 206 may be formed on the corresponding redistribution layer 204 to electrically connect to the corresponding bonding pad 104. In one embodiment, the bonding wire 206 directly contacts with the redistribution layer 204. In another embodiment, the redistribution layer 204 is not formed, and the bonding wire may electrically contact with the bonding pad 104.

Figure 15:
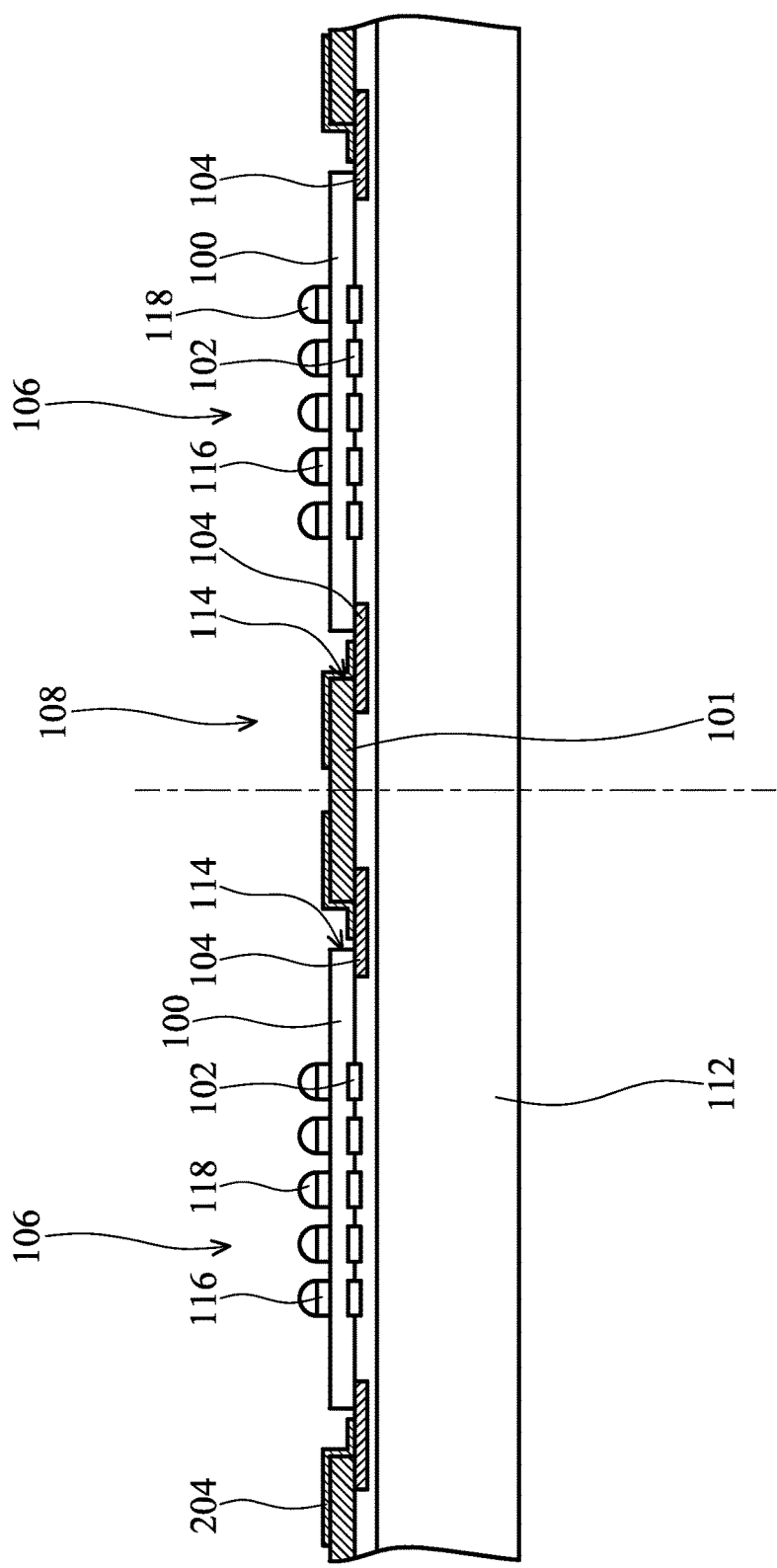
FIGS. 15-16 are cross-sectional views showing the steps of forming a chip package according to an embodiment of the present invention.
Figure 16:
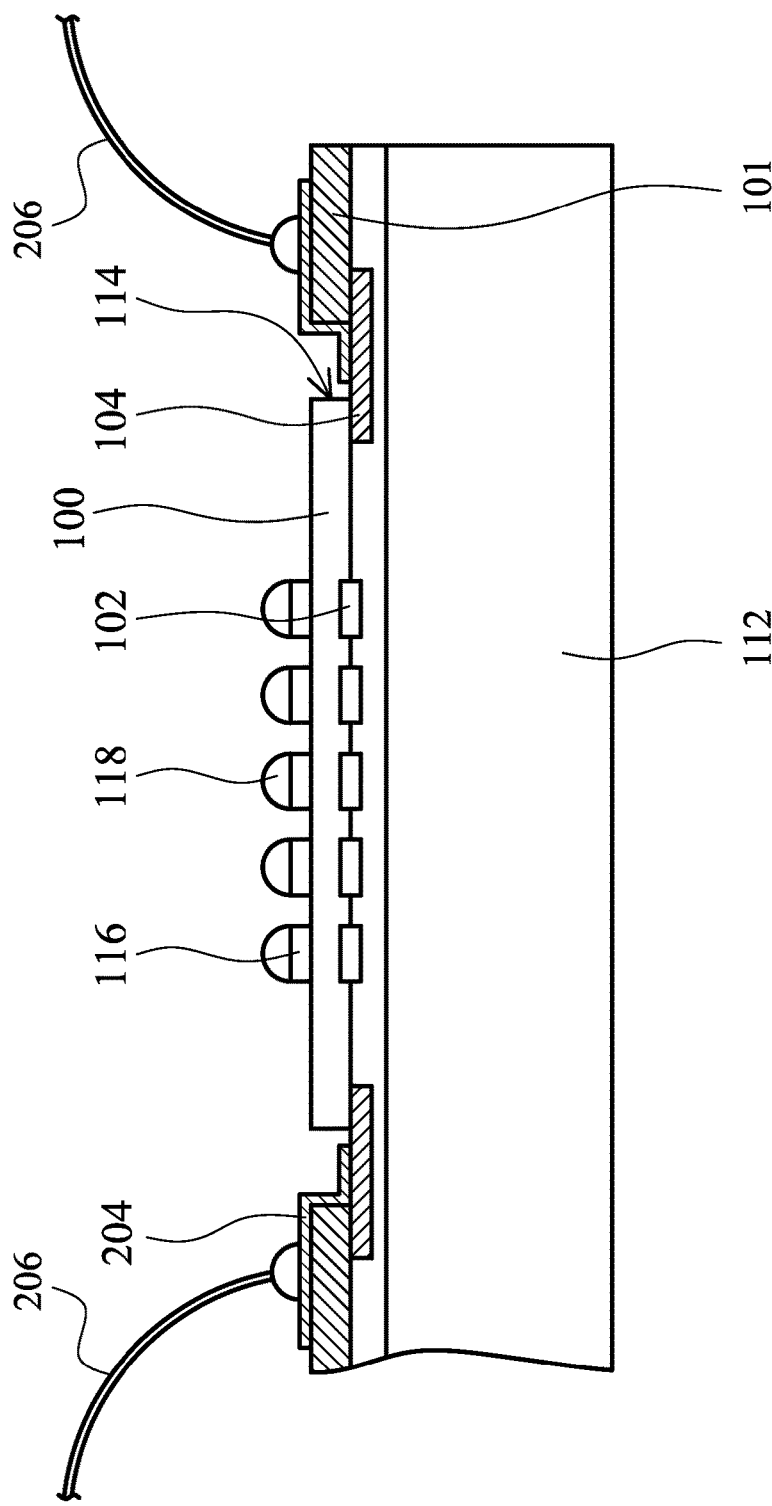

FIGS. 15-16 are cross-sectional views showing the steps of forming a chip package according to an embodiment of the present invention, wherein same or similar reference numbers are used to designate same or similar elements.

As shown in FIG. 15, a structure similar to that shown in FIG. 5 is provided. The main difference is that the first substrate 101 is constructed by a plurality of semiconductor bulks (also called supporting bricks) which are electrically insulated from each other. That is, each of the first substrates 101 is electrically connected to a corresponding one of the bonding pads. In this case, no insulating layer is formed on the first substrate 101.

Then, a conducting layer may be formed on the first substrate 100 and 101 and the exposed bonding pads 104. The conducting layer may then be patterned to form redistribution layers 204. Then, color filters 116 and micro lens 118 may be optionally formed on the photosensitive devices 102.

Next, as shown in FIG. 16, a dicing process is performed along the predetermined scribe lines to form a plurality of chip packages which are separated from each other. In one embodiment, at least a bonding wire 206 may be formed to electrically connect to the bonding pad 104. For example, the bonding wire 206 may be formed on the corresponding redistribution layer 204 to electrically connect to the corresponding bonding pad 104. In one embodiment, the bonding wire 206 directly contacts with the redistribution layer 204. In another embodiment, the redistribution layer 204 is not formed, and the bonding wire may electrically contact with the bonding pad 104.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
    a semiconductor chip having a substrate;
    a supporting brick separated from the substrate by a distance, wherein the substrate and the supporting brick have a same thickness, and wherein the substrate and the supporting brick each have a first surface and a second surface opposite to the first surface;
    a bonding pad having a surface extending across the first surface of the substrate, a space separating the substrate and the supporting brick, and the first surface of the supporting brick;
    a photo sensitive device disposed on the first surface of the substrate and electrically connected to the bonding pad;
    a redistribution layer covering the bonding pad, a first sidewall of the substrate, and a second sidewall of the supporting brick, wherein the redistribution layer comprises a first portion disposed in the space between the substrate and the supporting brick and directly contacting the bonding pad, a second portion extending across the second surface of the substrate, and a third portion extending across the second surface of the supporting brick; and
    a bonding wire directly contacting the third portion of the redistribution layer.

2. The chip package as claimed in claim 1, wherein the supporting brick and the substrate are co-planar.

3. The chip package as claimed in claim 1, further comprising an insulator formed between the supporting brick and the substrate to isolate the substrate and the supporting brick, wherein the bonding pad is disposed across the insulator.

4. The chip package as claimed in claim 1, wherein the supporting brick and the substrate are the same material.

5. The chip package as claimed in claim 4, wherein the supporting brick is silicon.

6. The chip package as claimed in claim 1, further comprising an insulating layer disposed between the redistribution layer and the supporting brick or the substrate.

7. The chip package as claimed in claim 1, wherein the semiconductor chip package comprises a back side illumination image sensor.

8. A method for fabricating the chip package as set forth in claim 1, comprising:
    providing a wafer with a substrate having a plurality of die regions, the substrate having a first surface and a second surface opposite to the first surface, wherein a plurality of photo sensitive devices are supported by or formed on the first surface of the substrate and a plurality of bonding pads are formed on the first surface of the substrate, and wherein the photo sensitive devices are electrically connected to the bonding pads;
    packaging the substrate at a wafer level, comprising:
        patterning the substrate to form a supporting brick in each die region for separating the supporting brick from the substrate by a distance and exposing the bonding pad, wherein the substrate and the supporting brick have a same thickness, wherein the supporting bricks each have a first surface and a second surface opposite to the first surface, and wherein the bonding pads have a surface extending across the first surface of the substrate, a space separating the substrate and a respective one of the supporting bricks, and the first surface of the respective one of the supporting bricks;
        forming a plurality of redistribution layers, each covering a respective one of the bonding pads, a first sidewall of the substrate, and a second sidewall of a respective one of the supporting bricks, wherein the redistribution layer comprises a first portion disposed in the space between the substrate and the respective one of the supporting bricks and directly contacting the respective one of the bonding pads, a second portion extending across the second surface of the substrate, and a third portion extending across the second surface of the respective one of the supporting bricks; and
        forming bonding wires directly contacting the third portions of the redistribution layer, respectively.

9. The method for fabricating the chip package as claimed in claim 8, wherein the second surface of the substrate is patterned to form the supporting bricks and to form a patterned opening for exposing the bonding pads.

10. The method for fabricating the chip package as claimed in claim 9, wherein the substrate serves as a first substrate, the first surface thereof comprising a light back surface and the second surface thereof comprising a light-emitting surface or light incident surface, the wafer level packaging further comprises:
    providing a first packaging layer to cover the light-emitting surface or the light incident surface of the first substrate;
    attaching the back surface of the first substrate to a second substrate; and
    segmenting the second substrate along a predetermined scribe line between two die regions into a plurality of carriers corresponding to the die regions.

11. The method for fabricating the chip package as claimed in claim 8, further comprising performing a dicing process along predetermined scribe lines of the substrate to form a plurality of separate chip packages.

12. The method for fabricating the chip package as claimed in claim 11, wherein the step of forming the bonding wires is performed after the dicing process is performed.

13. The method for fabricating the chip package as claimed in claim 8, further comprising forming an insulating layer between the redistribution layer and the substrate.

14. The method for fabricating the chip package as claimed in claim 8, wherein after the redistribution layer are formed, the method further comprises forming micro lenses on the die regions, respectively.

15. The method for fabricating the chip package as claimed in claim 14, further comprising forming color filters between the die regions and the micro lenses, respectively.

* * * * *